US012713951B2

(12) United States Patent
Shin et al.

(10) Patent No.: US 12,713,951 B2
(45) Date of Patent: Aug. 18, 2026

(54) SEMICONDUCTOR DEVICE AND METHOD OF MAKING REDISTRIBUTION LAYERS WITH INTENSIVE PULSED LIGHT IRRADIATION

(71) Applicant: STATS ChipPAC Pte. Ltd., Singapore (SG)

(72) Inventors: YongMoo Shin, Incheon (KR); HeeSoo Lee, Incheon (KR); SuJeong Kwon, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 406 days.

(21) Appl. No.: 18/351,300

(22) Filed: Jul. 12, 2023

(65) Prior Publication Data

US 2025/0022792 A1 Jan. 16, 2025

(51) Int. Cl.

| | |
|---|---|
| ***H10W 70/66*** | (2026.01) |
| ***H10P 95/90*** | (2026.01) |
| ***H10W 74/01*** | (2026.01) |
| ***H10W 74/10*** | (2026.01) |
| ***H10W 74/15*** | (2026.01) |

(52) U.S. Cl.

CPC ........... *H10W 70/664* (2026.01); *H10P 95/90* (2026.01); *H10W 74/012* (2026.01); *H10W 74/10* (2026.01); *H10W 74/15* (2026.01)

(58) Field of Classification Search

CPC . H10W 70/664; H10W 74/012; H10W 74/10; H10W 74/15; H10W 70/099; H10P 34/42; H10P 95/90; H10P 72/0436; H01L 2224/0231; H01L 2224/02331; H01L 2224/02333; H01L 2224/03505; H05K 1/092

See application file for complete search history.

(56) References Cited

U.S. PATENT DOCUMENTS

| | | | | |
|---|---|---|---|---|
| 6,204,558 | B1 * | 3/2001 | Yanagida ............. | H05K 3/3436 257/737 |
| 8,535,553 | B2 | 9/2013 | Kong et al. | |
| 8,710,649 | B1 | 4/2014 | Huemoeller et al. | |
| 9,305,854 | B2 | 4/2016 | Shim et al. | |
| 10,421,123 | B2 | 9/2019 | Jeong et al. | |
| 2009/0152715 | A1 | 6/2009 | Shim et al. | |
| 2012/0028411 | A1 * | 2/2012 | Yu ......................... | H01L 21/561 438/118 |
| 2015/0179602 | A1 | 6/2015 | Camacho et al. | |

(Continued)

FOREIGN PATENT DOCUMENTS

| | | | | |
|---|---|---|---|---|
| CN | 110112263 | * | 8/2019 | ............. H10H 20/01 |
| CN | 220324452 | * | 1/2024 | ........... H01L 23/367 |

(Continued)

*Primary Examiner* — Mary A Wilczewski

(74) *Attorney, Agent, or Firm* — Brian M. Kaufman; Robert D. Atkins; PATENT LAW GROUP: Atkins and Associates, P.C.

(57) ABSTRACT

A semiconductor device has a substrate. An electrical component is disposed over the substrate. An encapsulant is deposited over the electrical component. A conductive layer is formed over the substrate opposite the electrical component after depositing the encapsulant. The conductive layer is deposited as a plurality of graphene-coated metal balls in a matrix. The conductive layer is sintered by intensive pulsed light (IPL) irradiation.

14 Claims, 14 Drawing Sheets

(56) References Cited

U.S. PATENT DOCUMENTS

| | | | | |
|---|---|---|---|---|
| 2018/0247584 | A1* | 8/2018 | Chen | G09G 3/32 |
| 2019/0164859 | A1* | 5/2019 | Chen | H01L 23/373 |
| 2021/0193686 | A1* | 6/2021 | You | G02F 1/13452 |
| 2024/0194629 | A1* | 6/2024 | Shin | H01L 24/83 |
| 2024/0413095 | A1* | 12/2024 | Shin | H10W 42/20 |
| 2025/0022792 | A1* | 1/2025 | Shin | H10W 70/664 |
| 2025/0079380 | A1* | 3/2025 | Shin | H01L 24/20 |
| 2026/0005153 | A1* | 1/2026 | Chun | H10W 70/65 |

FOREIGN PATENT DOCUMENTS

| | | |
|---|---|---|
| KR | 10-2012-0132424 | 12/2012 |
| KR | 101465616 | 11/2014 |
| KR | 101895114 | 9/2018 |

* cited by examiner 200
140
120
156
194
104
114
122
124
130
132
133
190
192
196
198

SEMICONDUCTOR DEVICE AND METHOD OF MAKING REDISTRIBUTION LAYERS WITH INTENSIVE PULSED LIGHT IRRADIATION

FIELD OF THE INVENTION

The present invention relates in general to semiconductor devices and, more particularly, to a semiconductor device and method of making redistribution layers using intensive pulsed light irradiation.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, power conversion, photo-electric, and creating visual images for television displays. Semiconductor devices are found in the fields of communications, networks, computers, entertainment, and consumer products. Semiconductor devices are also found in military applications, aviation, automotive, industrial controllers, and office equipment.

Semiconductor device manufacturers are continually striving to make smaller semiconductor devices to meet the demands of electronic device manufacturers and consumers alike. As the density of components within semiconductor packages increases, the printed circuit boards (PCBs) used in semiconductor packages must have smaller pitches between conductors. The smaller pitches increase vulnerability of the PCBs to insulation failure, which can result in short circuits between adjacent conductive traces. One major issue that causes short circuits is ion migration from one conductive trace that can extend through the adjacent insulating layers and eventually reach another conductive trace. Therefore, a need exists for a PCB manufacturing method that is less susceptible to ion migration.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements assigned the same reference number in the figures have a similar function to each other. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the semiconductor package. The electrical connections can be made with conductive layers, bumps, stud bumps, conductive paste, or wirebonds. An encapsulant or other molding material is deposited over the semiconductor package to provide physical support and electrical isolation. The finished semiconductor package is then inserted into an electrical system and the functionality of the semiconductor device is made available to the other system components.

Figure 1A:
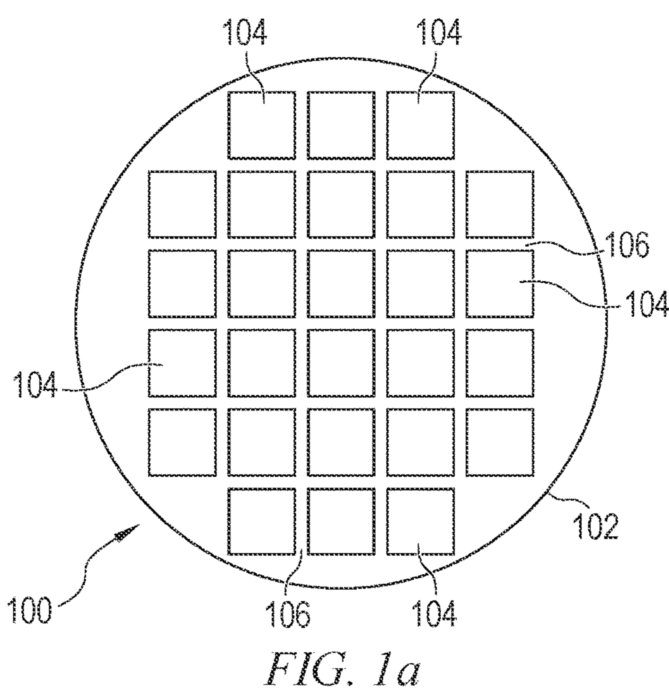
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm). Alternatively, wafer 100 can be a mold surface, organic or inorganic substrate, or target substrate suitable for graphene transfer.

Figure 1B:
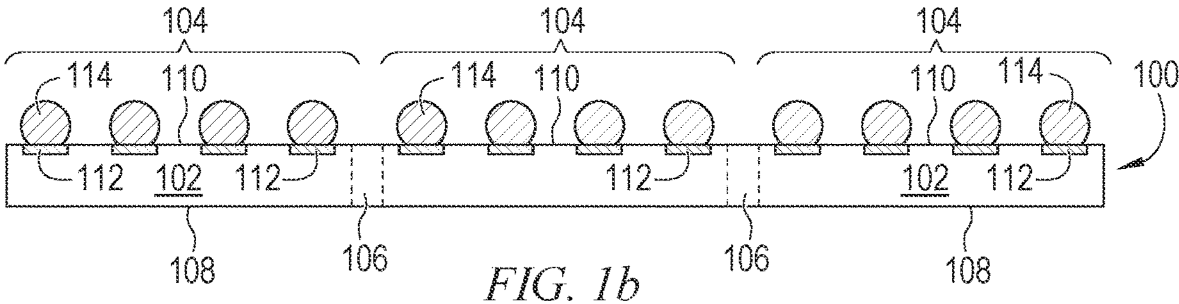

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed over or within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, power devices, or other signal processing circuit. Semiconductor die 104 may also contain IPDs, such as inductors, capacitors, and resistors, for RF signal processing.

An electrically conductive layer 112 is formed over active surface 110 using physical vapor deposition (PVD), chemical vapor deposition (CVD), electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under-bump metallization (UBM) having a wetting layer, barrier layer, and adhesion layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
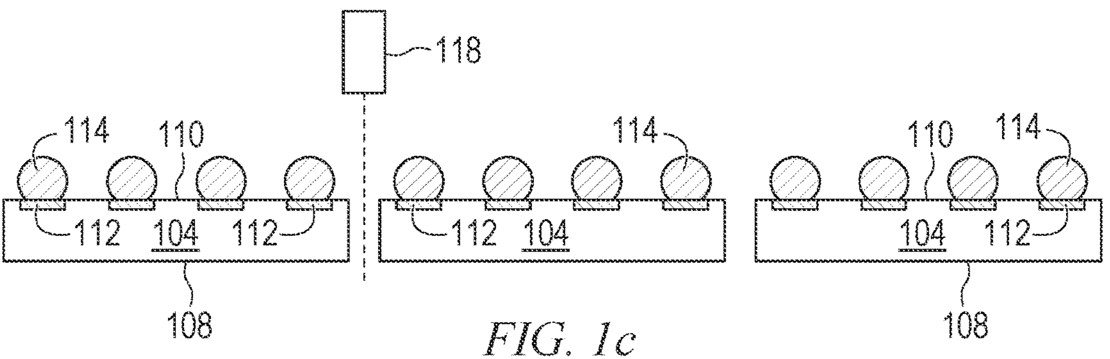

In FIG. 1*c*, semiconductor wafer 100 is singulated through saw street 106 using a saw blade or laser cutting tool 118 into individual semiconductor die 104. The individual semiconductor die 104 can be inspected and electrically tested for identification of known good die (KGD) or known good unit (KGU) after singulation.

Figure 2A:
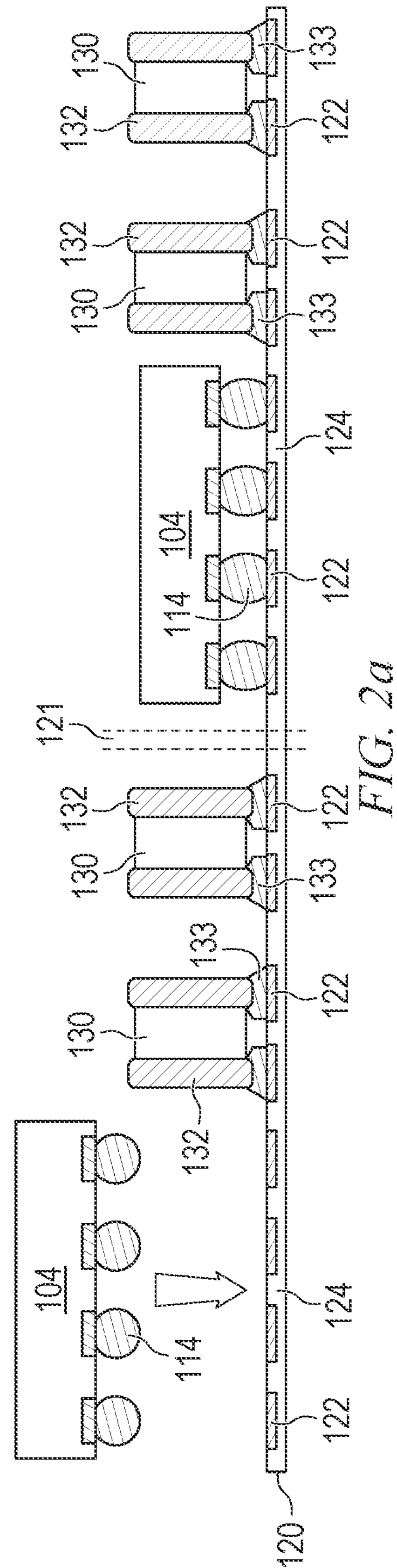
FIGS. 2a-2k illustrate a process of forming a semiconductor package with graphene-based redistribution layers sintered by intensive pulsed light irradiation.

FIGS. 2*a*-2*k* illustrate a process of forming a semiconductor package with graphene-based redistribution layers sintered by intensive pulsed light (IPL) irradiation. FIG. 2*a* shows a cross-sectional view of a single-layered PCB or substrate 120 including conductive layer 122 and insulating layer 124. While a single substrate 120 suitable to form two semiconductor packages separated by saw street 121 is shown, hundreds or thousands of units are commonly manufactured and processed on a single substrate before being singulated from each other, using the same steps described herein performed en masse. A separate substrate 120 could also be used for each unit being manufactured, the substrate being singulated before the steps shown in FIG. 2*a* and a plurality of individual substrates being placed on a common carrier for processing.

Conductive layer 122 can be one or more layers of Al, Cu, Sn, Ni, Au, Ag, or other suitable electrically conductive material. Conductive layers can be formed using PVD, CVD, electrolytic plating, electroless plating, or another suitable metal deposition process. Conductive layer 122 provides horizontal electrical interconnect across substrate 120. Portions of conductive layer 122 can be electrically common or electrically isolated depending on the design and function of semiconductor die 104 and other electrical components.

Insulating layer 124 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layers can be formed using PVD, CVD, printing, lamination, spin coating, spray coating, sintering, or thermal oxidation. Insulating layer 124 provides structural support and electrical isolation for conductive layer 122.

While only a single insulating and conductive layer are used, any number of conductive layers 122 and insulating layers 124 can be interleaved over each other to form the initial substrate 120 in FIG. 2*a*. A copper-clad laminate substrate is used in one embodiment. Any other suitable type of package substrate or leadframe is used for substrate 120 in other embodiments. Insulating layer 124 can be pre-formed, with conductive layer 122 patterned over a top surface of the insulating layer. Conductive layer 122 may also be embedded into insulating layer 124.

Semiconductor die 104 and electrical components 130 are disposed on substrate 120 and electrically and mechanically connected to conductive layer 122. For example, electrical components 130 can be discrete electrical devices, such as diodes, transistors, resistors, capacitors, and inductors. Electrical components 130 disposed on substrate 120 can include other semiconductor die, semiconductor packages, surface mount devices, RF components, and discrete electrical devices. Any of the electrical components 130 can have integrated passive devices (IPDs) formed in or on the electrical components. Any number and type of electrical components can be mounted onto substrate 120.

Semiconductor die 104 and electrical components 130 are positioned over substrate 120 using a pick and place machine or operation and brought into contact with conductive layer 122. Semiconductor die 104 are disposed with bumps 114 oriented toward substrate 120. Semiconductor die 104 are electrically and mechanically connected to conductive layer 122 by reflowing bumps 114. Terminals 132 of electrical components 130 are electrically and mechanically connected to conductive layer 122 using solder or conductive paste 133.

Figure 2B:
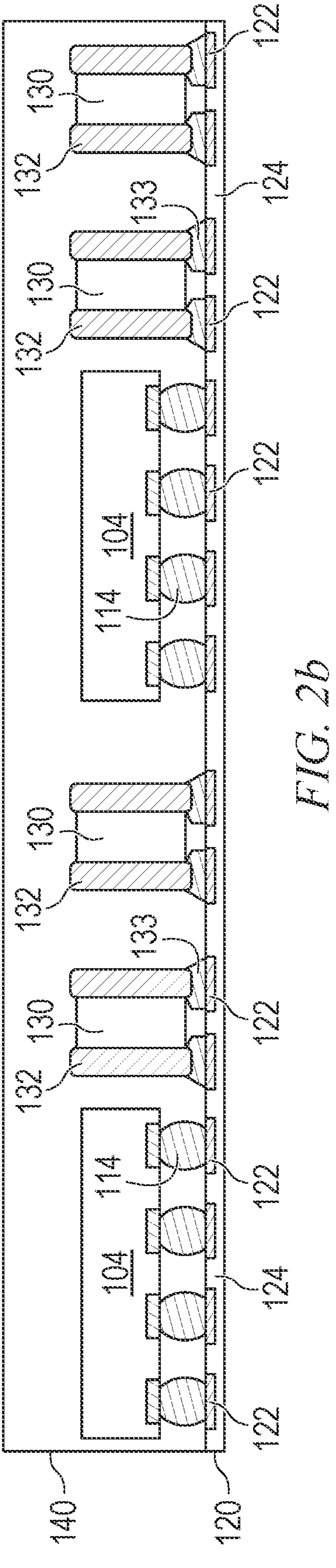

In FIG. 2*b*, encapsulant or molding compound 140 is deposited over and around substrate 120, semiconductor die 104, and electrical components 130 using a paste printing, compressive molding, transfer molding, liquid encapsulant molding, vacuum lamination, spin coating, or other suitable applicator. Encapsulant 140 can be liquid or granular polymer composite material, such as epoxy resin, epoxy acrylate, or another suitable polymer, with or without a suitable filler. Encapsulant 140 is non-conductive, provides structural support, and environmentally protects the semiconductor device from external elements and contaminants. Top surfaces of semiconductor die 104 or one or more components 130 can be exposed from encapsulant 140, to allow for subsequent electrical, mechanical, or thermal connection, by using film-assisted molding or by backgrinding after deposition of the encapsulant.

Figures 2C, 2D:
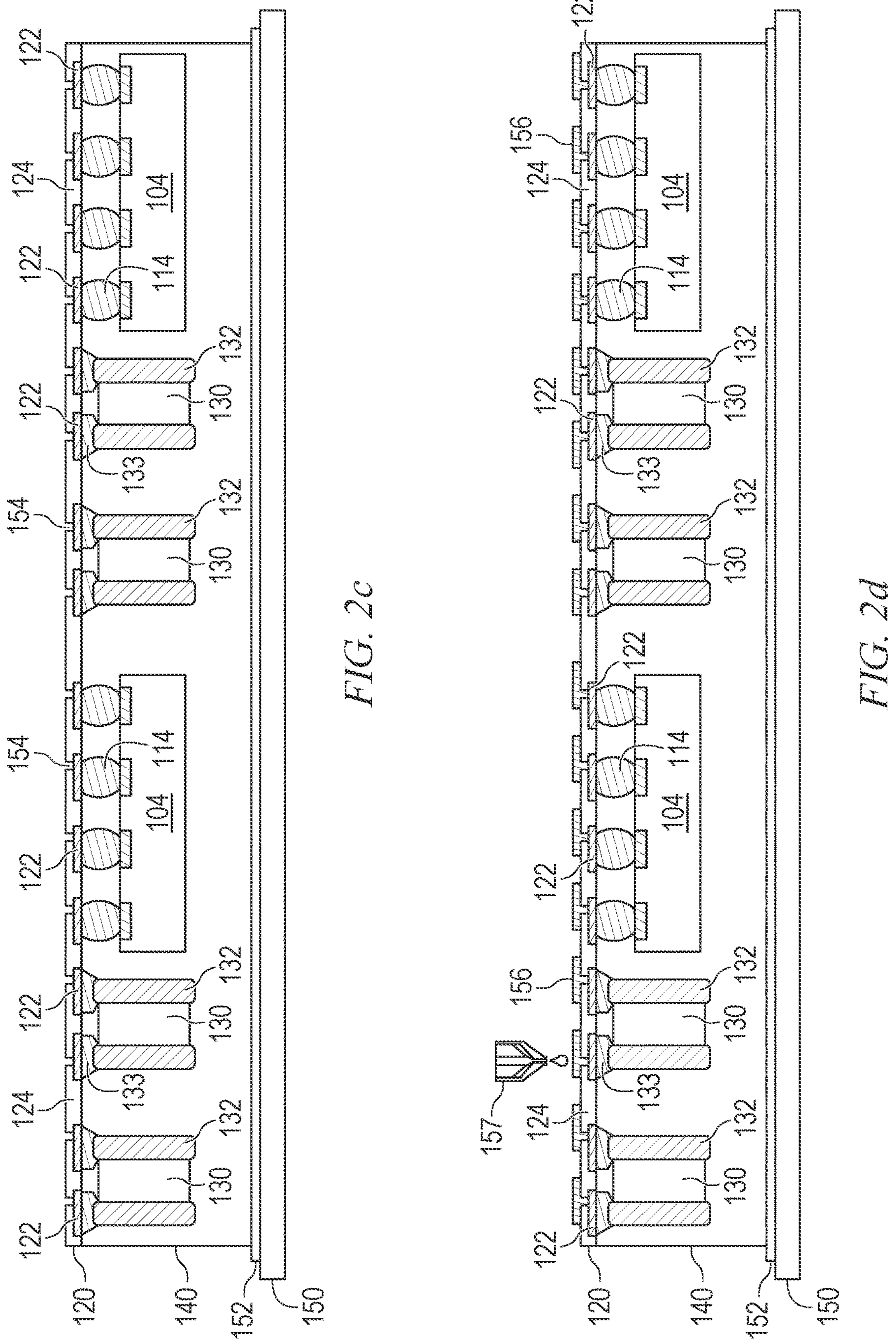

In FIG. 2*c*, the panel of substrate 120 and encapsulant 140 is flipped and disposed on carrier 150 containing sacrificial base material such as silicon, polymer, beryllium oxide, glass, or other suitable low-cost, rigid material for structural support. An interface layer or double-sided tape 152 is formed or disposed over carrier 150 as a temporary adhesive bonding film, thermal release layer, or UV release layer.

Figure 4:
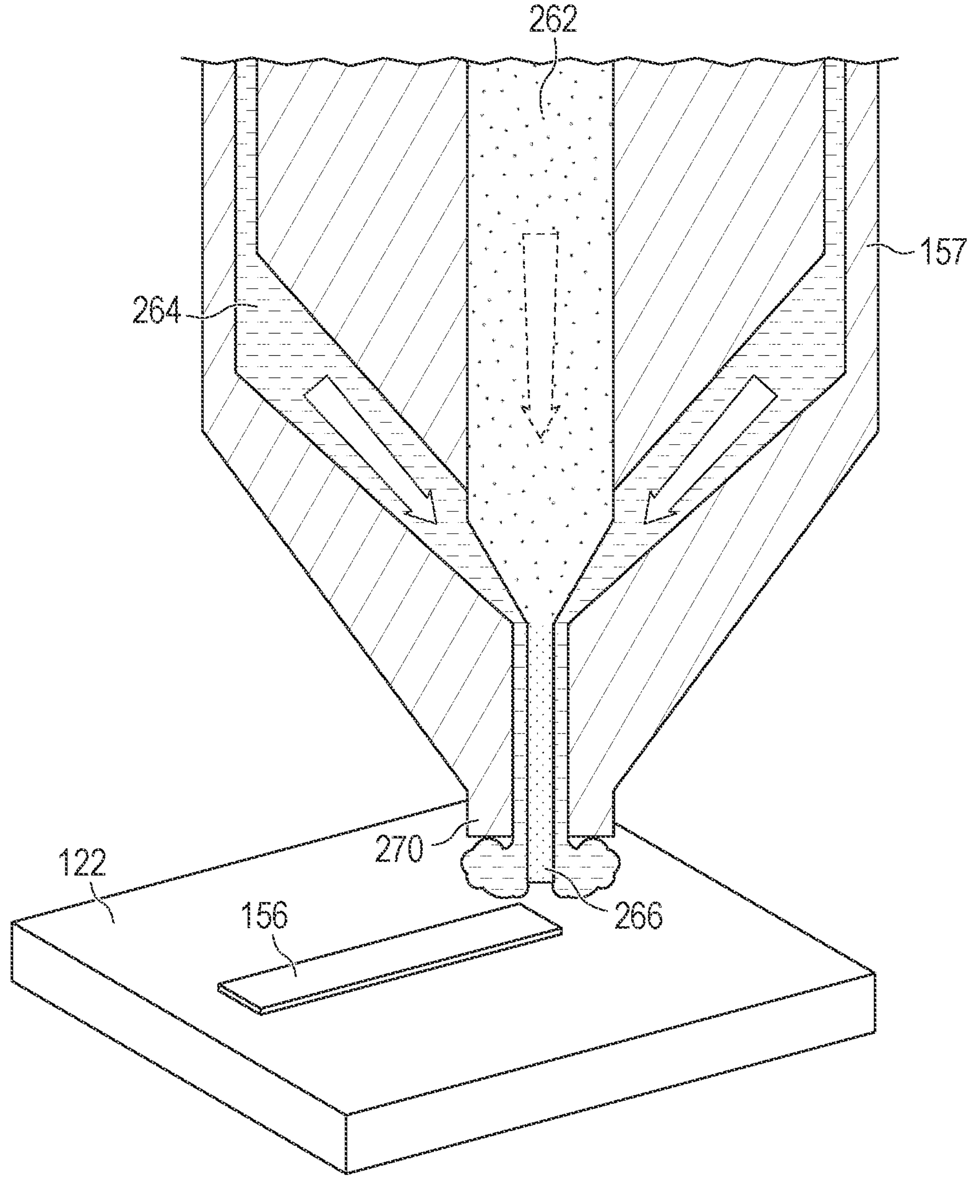
FIG. 4 illustrates using aerosol jet printing to deposit the conductive material.

A plurality of openings or vias 154 is formed through insulating layer 124 to expose conductive layer 122. Vias 154 are formed by laser ablation, chemical etching, mechanical etching, or another suitable process. In FIG. 2*d*, a redistribution layer (RDL) or conductive layer 156 is formed on insulating layer 124 by aerosol jet printing a graphene-based conductive ink with dispenser 157. FIG. 4 illustrates additional details of dispenser 157 and the aerosol jet printing process. Dispenser 157 moves across substrate 120 to print conductive layer 156 in the desired redistribution pattern. Portions of conductive layer 156 are formed over and into vias 154 to provide vertical routing between conductive layers. Conductive layer 156 physically and electrically contacts conductive layer 122 through openings 154.

Figure 2E:
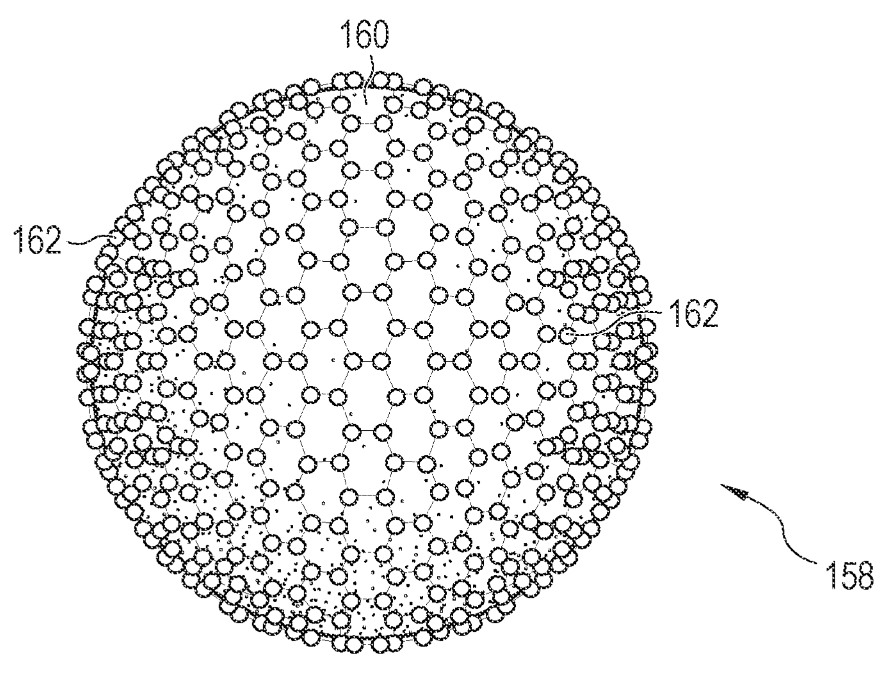

FIG. 2*e* illustrates detail of one of the graphene-coated metal balls 158 of conductive layer 156. Graphene-coated metal balls 158 are formed of a core 160 and a graphene shell or coating 162 formed on and around the core. In one embodiment, core 160 is Cu, Ag, Ni, phase change material (PCM), or other suitable metal or similar material. In some embodiments, a mix of some Cu cores 160 and some Ag cores 160 are used. FIG. 2*e* illustrates detail of graphene shell 162 formed as a mesh network around core 160. Graphene shell 162 is an allotrope of carbon with one or more layers of carbon atoms each arranged in a two-dimensional (2D) honeycomb lattice. Graphene shell 162 can be formed by CVD, wet chemical synthesis, or other suitable means. A plurality of graphene coatings 162 is formed on each core 160 in some embodiments.

For CVD, core 160 is placed in a chamber heated to 900-1080° C. A gas mixture of $CH_4/H_2/Ar$ is introduced into the chamber to initiate a CVD reaction. The carbon source decomposes in the high-temperature reaction chamber as the CVD reaction separates the carbon atoms from the hydrogen atoms, leaving graphene shell 162 on core 160. The release of carbon atoms over core 160 forms a continuous sheet of graphene shell 162. Additional information related to forming graphene coating 162 is disclosed in U.S. Pat. Nos. 8,535,553, 10,421,123, Korean Patent No. KR101465616, and Korean Patent No. KR101895114, which are all incorporated herein by reference.

Figure 2F:
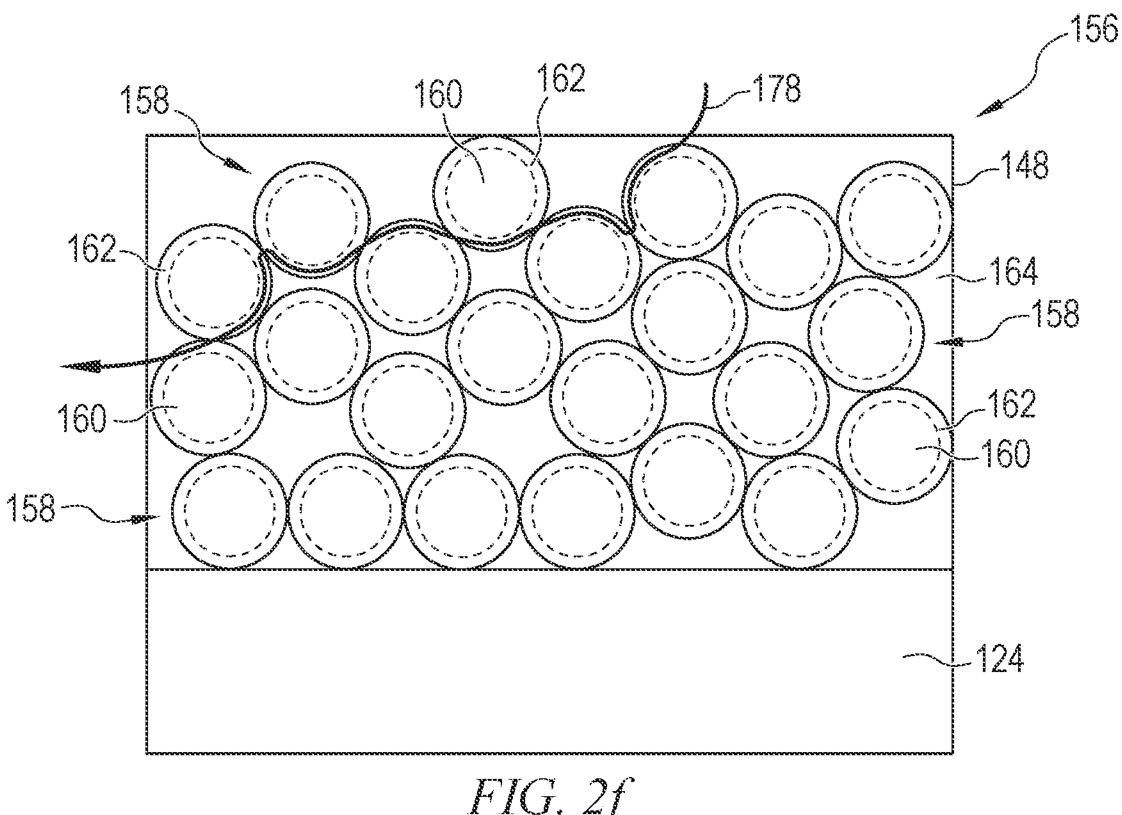

FIG. 2*f* shows further detail of conductive layer 156 formed from a plurality of graphene-coated metal balls 158. In one embodiment, conductive layer 156 includes matrix 164 and a plurality of cores 160 with graphene coating 162 embedded within the matrix. In one embodiment, matrix 164 is a thermoset material, such as epoxy resin or adhesive with binder and filler containing alumina, Al, aluminum zinc oxide, or other material having good conductive properties. Matrix 164 can be thermal grease such as silicon or polymer type, e.g., polymethyl methacrylate (PMMA) or polyethylene terephthalate (PET). Matrix 164 can be epoxy, polyester, or acryl in other embodiments. In another embodiment, matrix 164 is a polymer or composite epoxy with dispersed graphene, carbon nanotubes, conductive polymers, and the like. Conductive layer 156 can be applied as an ink of graphene-coated metal balls 158 floating in matrix 164.

Each core 160, as embedded in matrix 164, is surrounded or covered by graphene coating or shell 162. In one embodiment, graphene shell 162 is a graphene paste or ink formed around a Cu or Ag core. In one embodiment, some cores 162 are formed from Cu while others are formed from Ag. Graphene coating 162 of each core 160 contacts the graphene coating of one or more adjacent cores. Cores 160 have sufficient density within matrix 164 that most if not all the graphene coatings around the cores contact at least one graphene coating around an adjacent core, and typically contact graphene coating of multiple adjacent cores.

Each graphene-coated metal ball 158 physically contacts adjacent graphene-coated metal balls within matrix 164 to create an electrically conductive path 178 including portions of interconnected graphene shells 162 on adjacent balls 158. The electrically conductive path 178 is the primary current carrier for conductive traces of conductive layer 156. The electrical charges flowing through many electrically conductive paths like 178 in balls 158 operate to carry electrical signals across substrate 120.

Figure 2G:
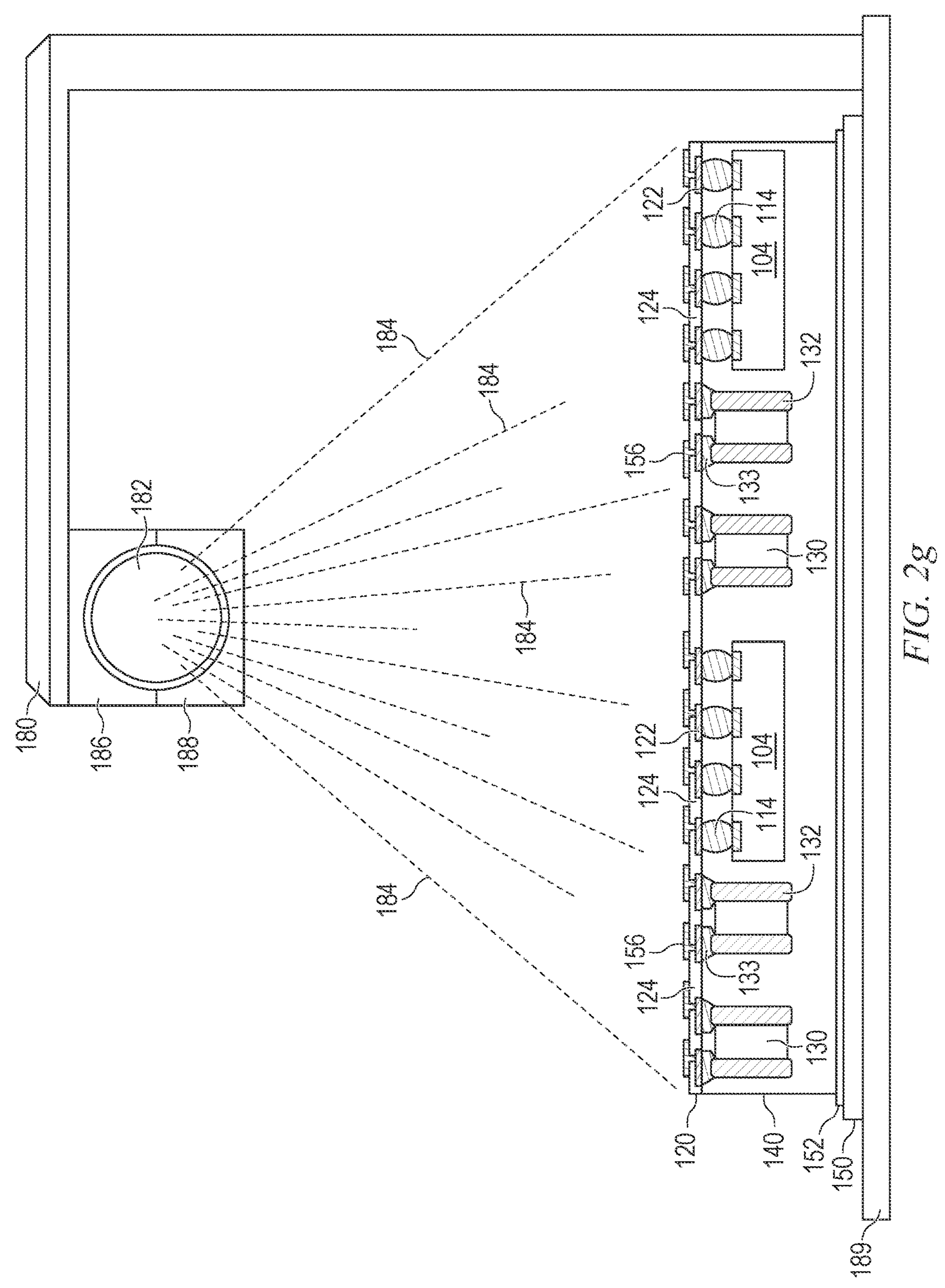

To ensure establishment of conductive paths 178 between all adjacent balls 158, conductive layer 156 is sintered as shown in FIG. 2*g*. Sintering is performed using an IPL device 180. IPL device 180 includes a xenon flashlamp 182 that emits light rays 184. Reflector 186 reflects light rays 184 to increase the amount of light emitted downward toward conductive layer 156. An ultraviolet filter 188 filters light rays 184. Platform 189 holds the devices being processed.

IPL uses intense pulses of non-coherent light emitted over a range of wavelengths. In one embodiment, the IPL wavelength extends from approximately 350 nanometers (nm) to 1200 nm. Xenon flashlamp 182 produces high output bursts of broad-spectrum light 184. Light 184 hitting matrix 164 with balls 158 sinters conductive layer 156 to solidify the material and electrical connections between the balls. Sintering conductive layer 156 with IPL irradiation can be completed in only several milliseconds, whereas traditional conductive layers in the prior art require a thermal heating process typically taking between 30 and 90 minutes.

In some embodiments, the panel with conductive layer 156 is placed into an oven for pre-processing before IPL irradiation. The oven temperature is set to between 170° C. and 280° C., and conductive layer 156 is heated for between 30 seconds and two minutes. In one embodiment, conductive layer 156 is heated at 250° C. for one minute. The oven pre-processing removes organic solvent from conductive layer 156. In some embodiments, the panel is placed into an oven for post-processing after IPL irradiation. The oven temperature for post-processing is between 90° C. and 120° C. for a length of time between five and ten minutes. Post-processing in the oven stabilizes the sintered material.

Forming conductive layer 156 with sintering done by IPL irradiation increases the number of units per hour (UPH) that can be manufactured, thus reducing manufacturing costs. Moreover, graphene has ten times the electrical conductivity of copper or silver by themselves so conductive layer 156 has an increased current carrying capability compared to the prior art. Graphene coating 162 increases thermal conductivity and hardness of conductive layer 156. Graphene coating 162 also reduces metal oxidation and ion migration, thus increasing the mean time between failures.

Substrate 120 with graphene-based conductive layer 156 formed as an additional routing layer may provide sufficient routing for the packages being formed in some embodiments. Substrate 120 and encapsulant 140 can be singulated to separate and ship the units after conductive layer 156 is completed. Alternatively, any additional number of graphene-based conductive layers can be successively formed over substrate 120 to accomplish the desired electrical routing.

Figure 2H:
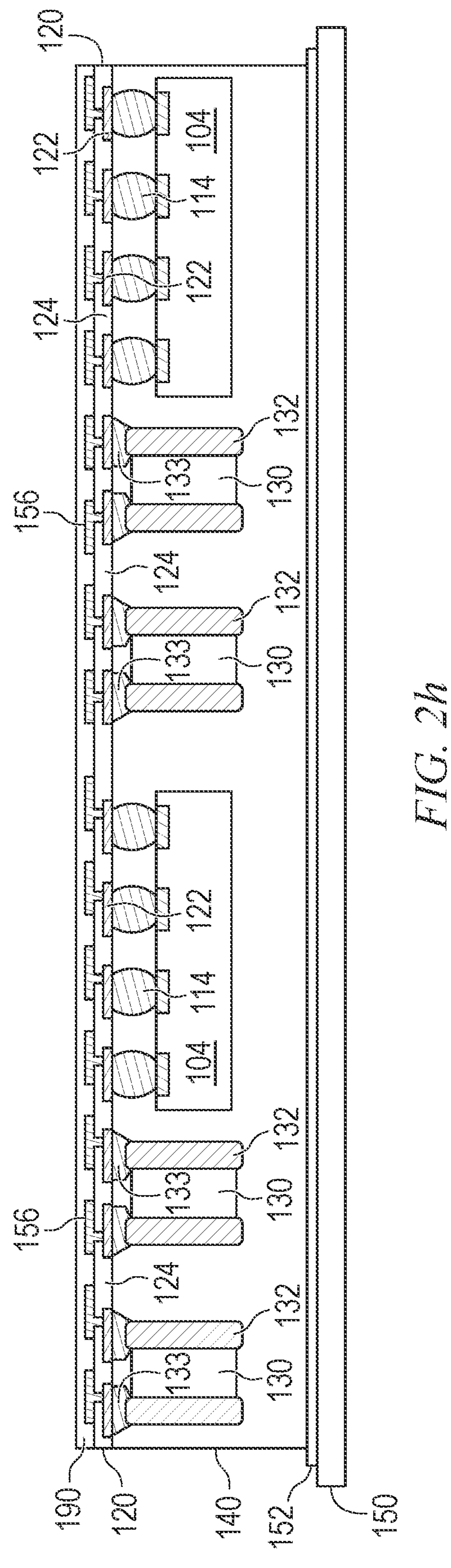

In FIG. 2*h*, an insulating layer 190 is formed over substrate 120 and conductive layer 156. Insulating layer 190 contains one or more layers of SiO2, Si3N4, SiON, Ta2O5, Al2O3, solder resist, polyimide, BCB, PBO, FR-4 and other material having similar insulating and structural properties. Insulating layer 190 can be formed using PVD, CVD, printing, lamination, spin coating, spray coating, sintering, or thermal oxidation.

Figure 2I:
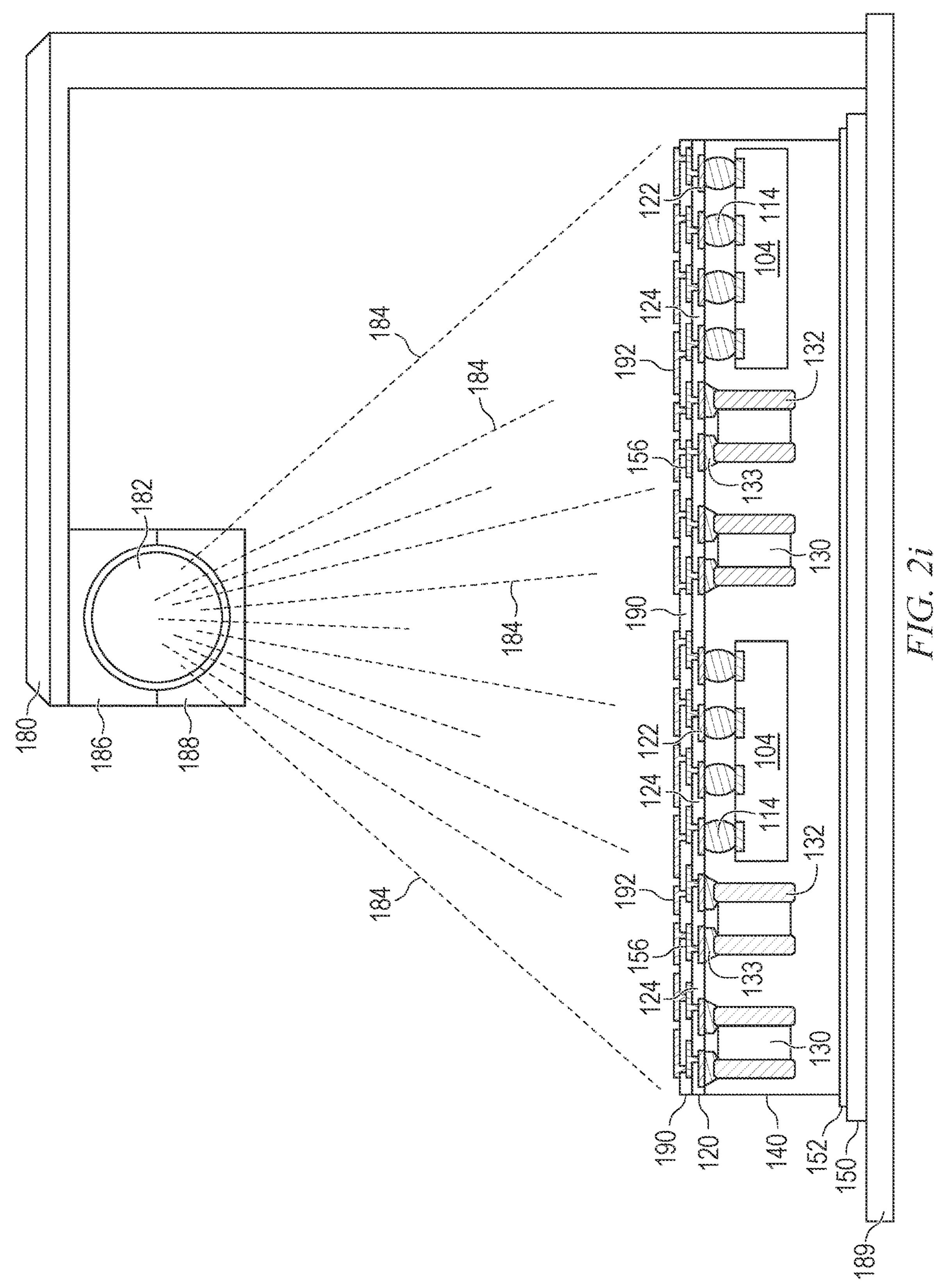

In FIG. 2*i*, openings are formed through insulating layer 190 and a conductive layer 192 is formed over and through insulating layer 190 as described above for conductive layer 156. Conductive layer 192 is formed from graphene-coated metal balls 158 as described above, and then sintered using IPL device 180. Conductive layer 192 may be the final conductive layer formed over substrate 120, or any suitable number of additional conductive layers can be successively formed in the same manner.

Figure 2J:
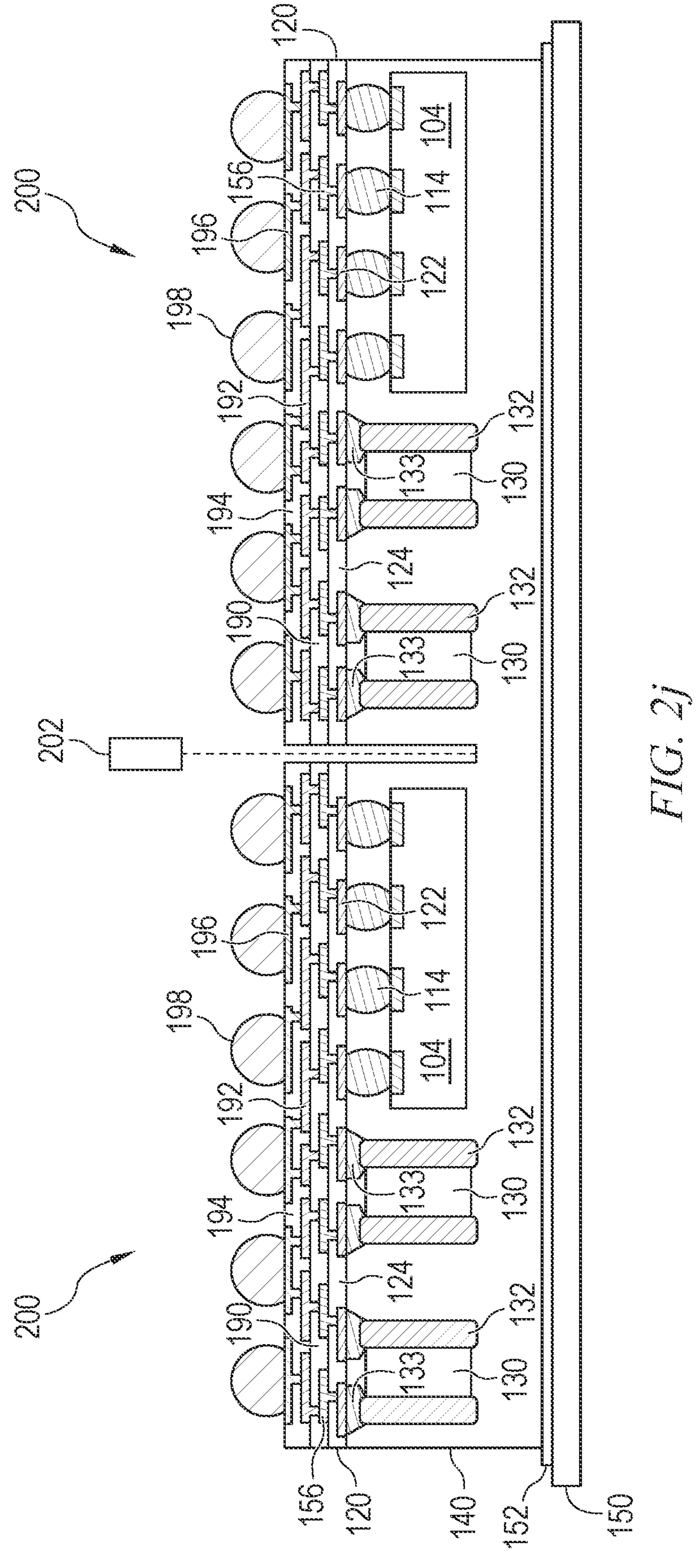

FIG. 2*j* shows package routing completed by forming one final insulating layer 194 and conductive layer 196. Insulating layer 194 is formed as described above for insulating layer 190, including the IPL irradiation process. Conductive layer 196 is graphene-based and formed as described above for conductive layers 156 and 192, including sintering by IPL irradiation. Bumps 190 are formed on conductive layer 196 as described above for bumps 114 on conductive layer 112. Encapsulant 140, substrate 120, insulating layer 190, and insulating layer 194 are singulated into individual semiconductor packages 200 using a saw blade or laser cutting tool 202.

Figure 2K:
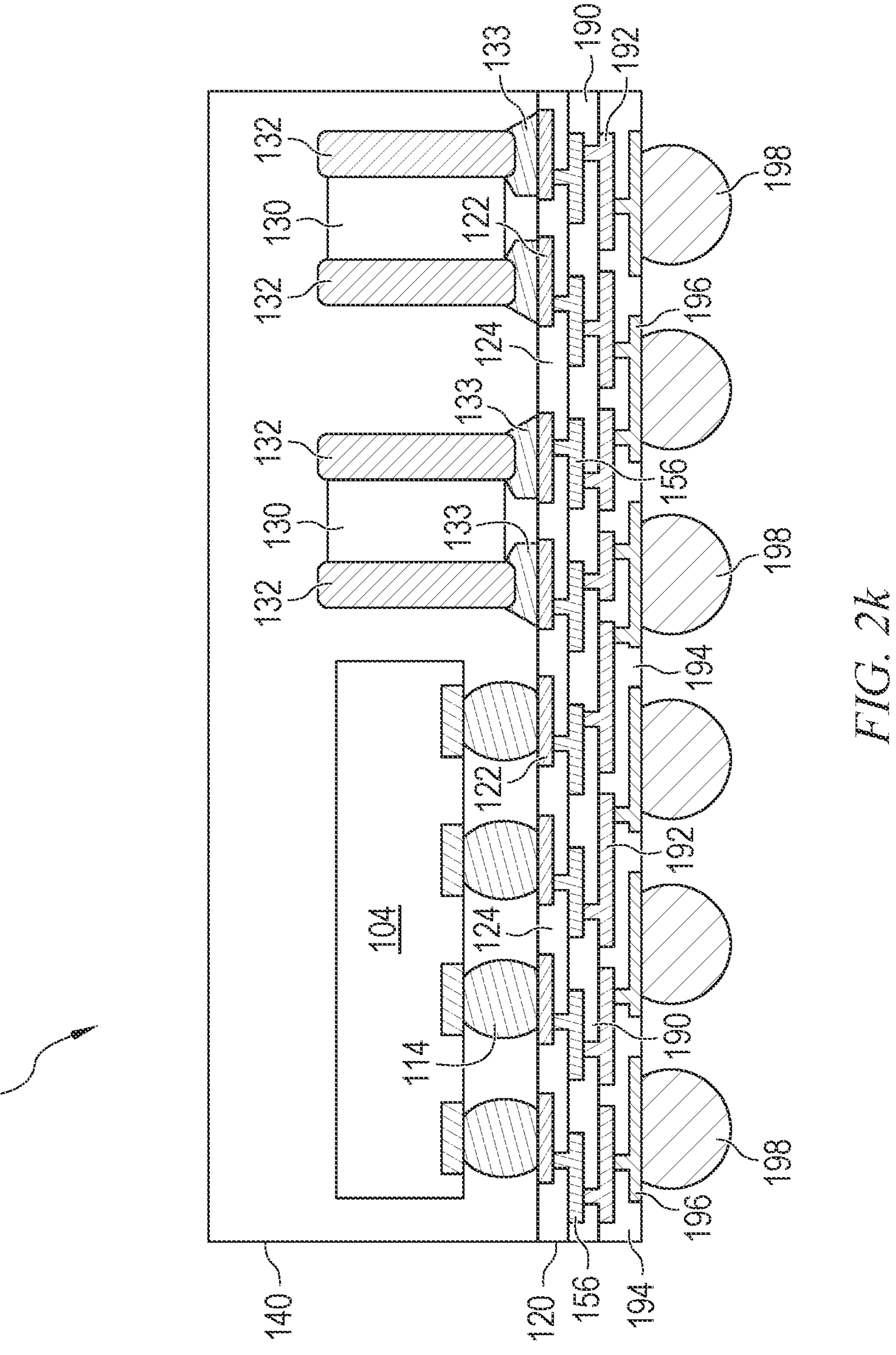

FIG. 2*k* illustrates a completed package 200. Semiconductor die 104, electrical components 130, and any other electrical components mounted on substrate 120 are electrically connected to bumps 198 through conductive layers 122, 156, 192, and 196. Conductive layers 156, 192, and 196 are formed from graphene-coated conductive balls 158. Graphene coating 162 increases electrical and thermal conductivity, hardness, and oxidation stability. Forming redistribution layers during packaging of semiconductor die 104 saves cost compared to the prior art, which requires that substrate 120 has the total required number of conductive layers pre-formed. Package 200, on the other hand, only has a single-layer PCB or substrate 120 pre-formed and then the remainder of the redistribution layers are formed during packaging. IPL irradiation of conductive and insulating layers increases the units per hour (UPH) that can be manufactured compared to the prior art by reducing the time required for each processing step. IPL irradiation sintering enables a package PCB to be formed as part of the packaging process rather than in advance as a completely separate process.

Figure 3A:
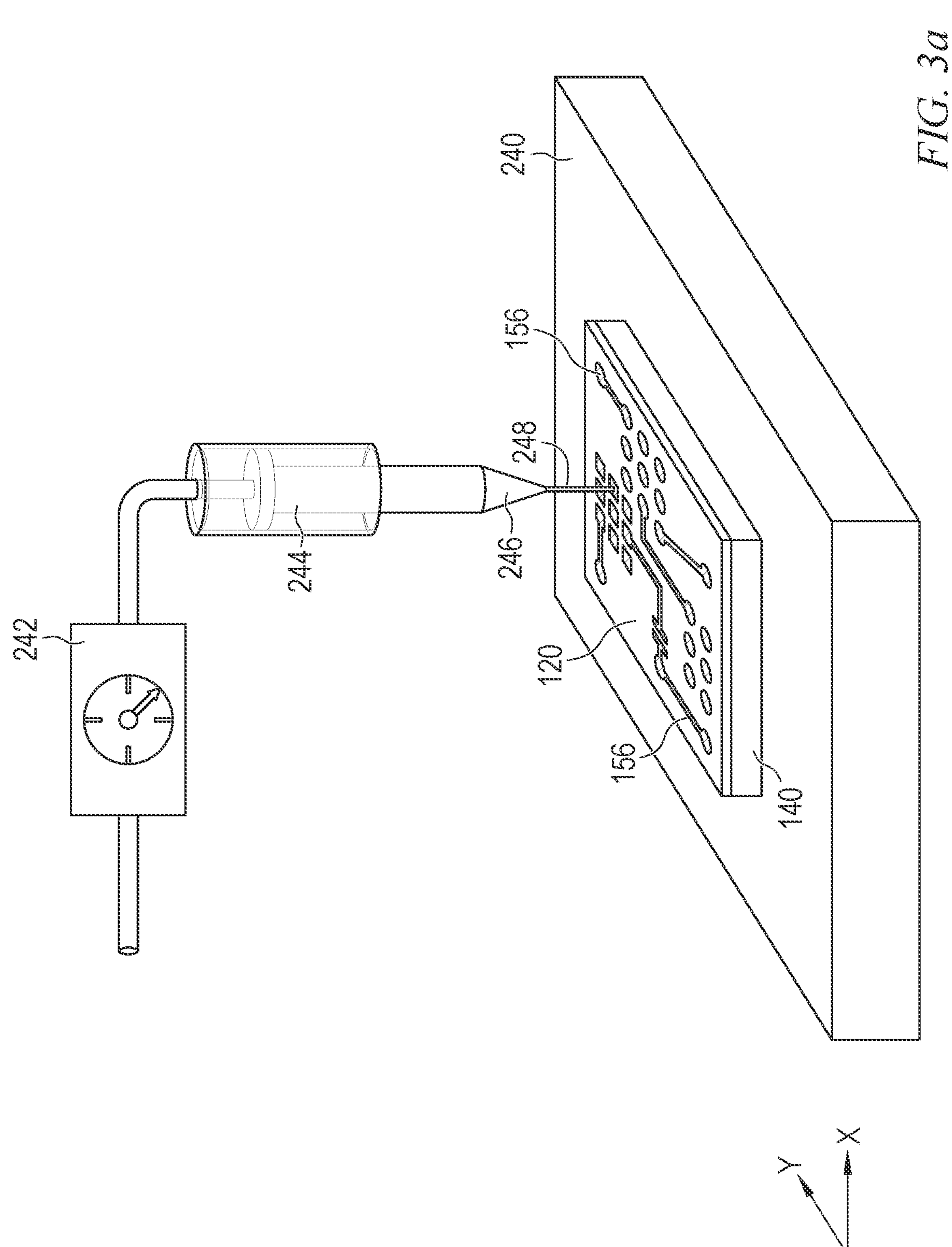
FIGS. 3a and 3b illustrate using EHD jet printing to deposit conductive material for the redistribution layers.
Figure 3B:
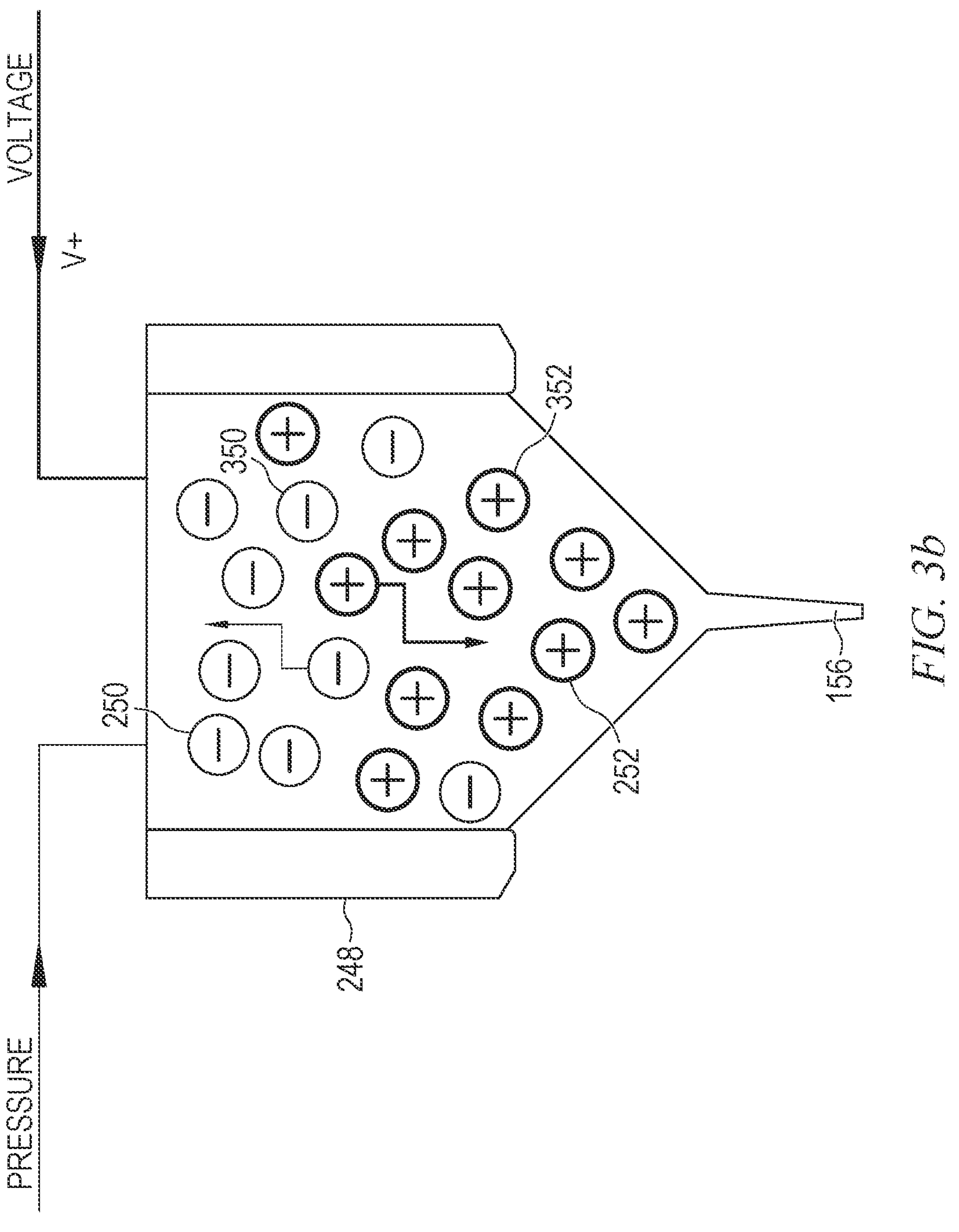

FIG. 3*a* shows depositing conductive layer 156 over substrate 120 using electrohydrodynamic (EHD) jet printing. Packages 200, or a panel of packages, are placed on substrate 240 capable of three-dimensional (x, y, and z directions) movement to control distribution of conductive material on substrate 120. Pneumatic regulator 242 with pressure gauge applies pressure to syringe pump 244 containing conductive material, such as conductive and non-conductive ink. Conical section 246 narrows the ink path to injection nozzle 248, which deposits the ink onto substrate 120 in a controlled manner. More specifically, injection nozzle 248 performs ink jetting by an electric field and pressure between the nozzle and substrate. In FIG. 3*b*, pressure is applied from pneumatic regulator 242. A voltage source induces an electric field shown as negative charges 250 and positive charges 252. The printed liquid is driven by the electric field to achieve direct pattern, high resolution printing of conductive layer 156.

FIG. 4 shows depositing conductive layer 156 over insulating layer 124 using aerosol jet printing. Dispenser 157 includes channel 262 for the flow of conductive material, such as conductive and non-conductive ink, and channel 264 for the flow of a gas, such as nitrogen. The conductive material is mixed with the gas and deposits the ink from nozzle or head 270 on insulating layer 124 as an aerosol jet. The printed liquid, i.e., conductive layer 156 is dispensed as a jetting of aerosol focused by sheath gas at the end of head 270.

Figure 5A:
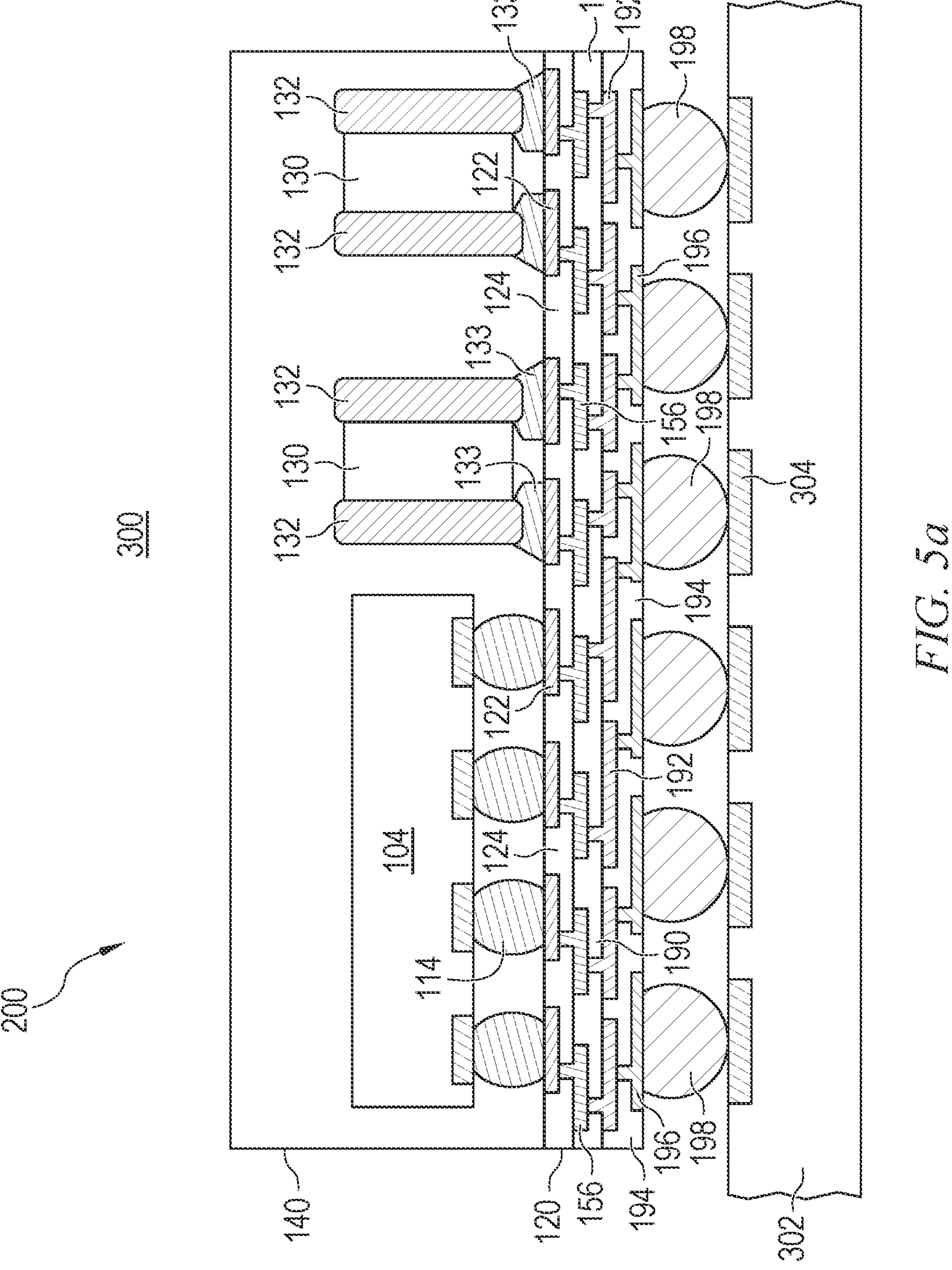
FIGS. 5a and 5b illustrate integrating the semiconductor packages into an electronic device.
Figure 5B:
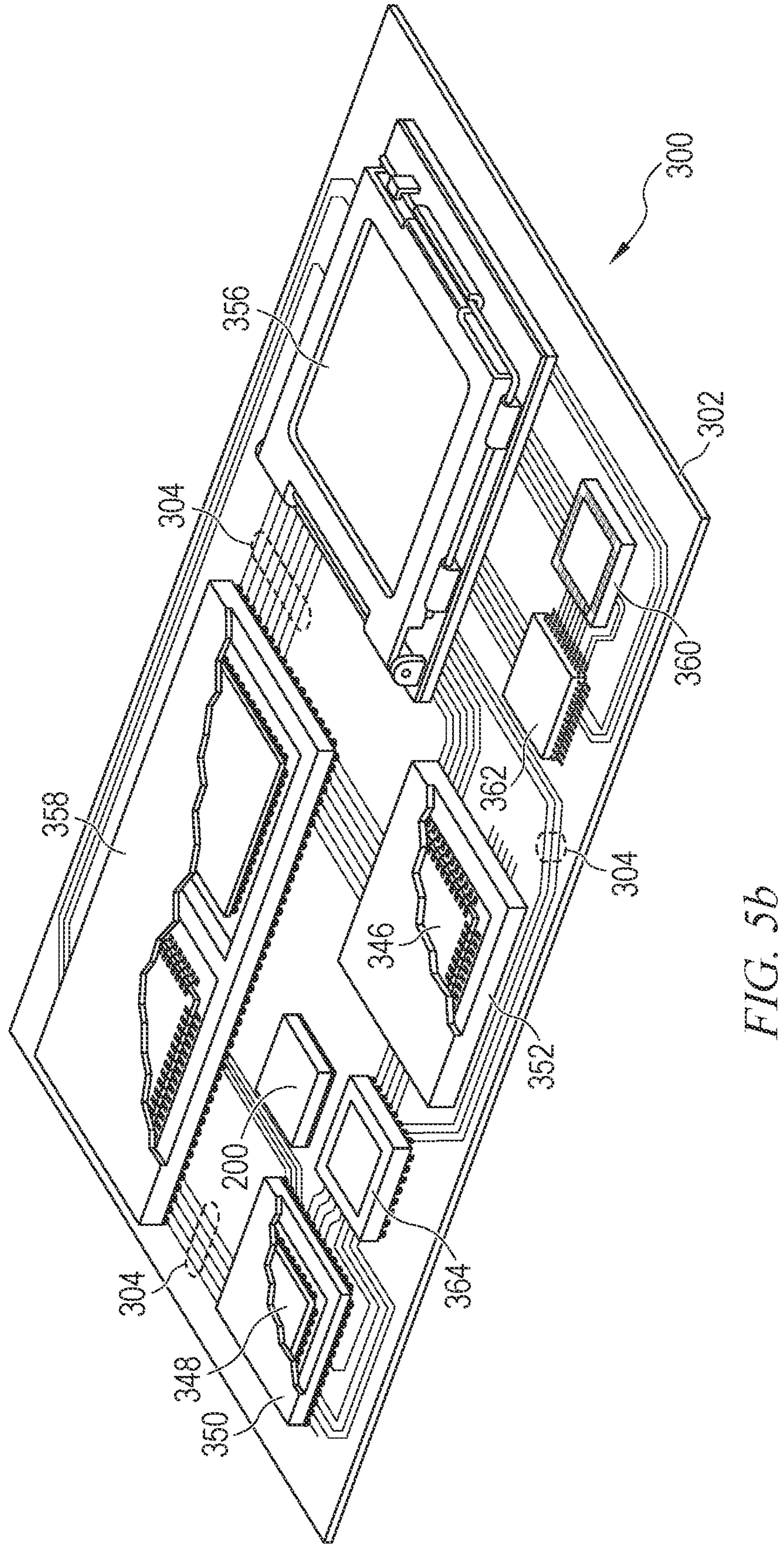

FIGS. 5*a* and 5*b* illustrate integrating the above-described semiconductor packages, e.g., semiconductor package 200, into a larger electronic device 300. FIG. 5*a* illustrates a partial cross-section of semiconductor package 200 mounted onto a printed circuit board (PCB) or other substrate 302 as part of electronic device 300. Bumps 198 are reflowed onto conductive layer 304 of PCB 302 to physically attach and electrically connect semiconductor package 200 to the PCB. In other embodiments, thermocompression or another suitable attachment and connection methods are used. In some embodiments, an adhesive or underfill layer is used between semiconductor package 200 and PCB 302. Semiconductor die 104 and electrical components 130 are electrically coupled to conductive layer 304 through bumps 198 and conductive layers 196, 192, 156, and 122.

FIG. 5*b* illustrates electronic device 300 having a chip carrier substrate or PCB 302 with a plurality of semiconductor packages disposed on a surface of PCB 302, including semiconductor package 200. Electronic device 300 can have one type of semiconductor package, or multiple types of semiconductor packages, depending on the application.

Electronic device 300 can be a stand-alone system that uses the semiconductor packages to perform one or more electrical functions. Alternatively, electronic device 300 can be a subcomponent of a larger system. For example, electronic device 300 can be part of a tablet, cellular phone, digital camera, communication system, or other electronic device. Alternatively, electronic device 300 can be a graphics card, network interface card, or other signal processing card that can be inserted into a computer. The semiconductor package can include microprocessors, memories, ASICs, logic circuits, analog circuits, RF circuits, discrete devices, or other semiconductor die or electrical components. Miniaturization and weight reduction are essential for the products to be accepted by the market. The distance between semiconductor devices may be decreased to achieve higher density. PCB 302 may have a more irregular shape to fit conveniently into more ergonomic and smaller device shells.

In FIG. 5*b*, PCB 302 provides a general substrate for structural support and electrical interconnect of the semiconductor packages disposed on the PCB. Conductive signal traces 304 are formed over a surface or within layers of PCB 302 using evaporation, electrolytic plating, electroless plating, screen printing, or other suitable metal deposition process. Signal traces 304 provide for electrical communication between each of the semiconductor packages, mounted components, and other external system components. Traces 304 also provide power and ground connections to each of the semiconductor packages.

In some embodiments, a semiconductor device has two packaging levels. First level packaging is a technique for mechanically and electrically attaching the semiconductor die to an intermediate substrate. S Second level packaging involves mechanically and electrically attaching the intermediate substrate to the PCB. In other embodiments, a semiconductor device may only have the first level packaging where the die is mechanically and electrically disposed directly on the PCB.

For the purpose of illustration, several types of first level packaging, including bond wire package 346 and flipchip 348, are shown on PCB 302. Additionally, several types of second level packaging, including ball grid array (BGA) 350, bump chip carrier (BCC) 352, land grid array (LGA) 356, multi-chip module (MCM) or SIP module 358, quad flat non-leaded package (QFN) 360, quad flat package 362, and embedded wafer level ball grid array (eWLB) 364 are shown disposed on PCB 302. In one embodiment, eWLB 364 is a fan-out wafer level package (Fo-WLP) or a fan-in wafer level package (Fi-WLP).

Depending upon the system requirements, any combination of semiconductor packages, configured with any combination of first and second level packaging styles, as well as other electrical components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:

providing a substrate;

disposing an electrical component over the substrate;

depositing an encapsulant over the electrical component;

forming a conductive layer over the substrate opposite the electrical component after depositing the encapsulant, wherein the conductive layer is deposited as a plurality of graphene-coated metal balls in a matrix;

sintering the conductive layer by intensive pulsed light (IPL) irradiation;

forming an insulating layer over the conductive layer; and forming a second conductive layer over the insulating layer, wherein the second conductive layer is deposited as a second plurality of graphene-coated metal balls in a second matrix.

2. The method of claim 1, wherein the plurality of graphene-coated metal balls comprises a plurality of cores formed from copper or silver, and each of the plurality of cores includes a graphene coating.

3. The method of claim 1, further including depositing the conductive layer by jet printing.

4. The method of claim 1, further including sintering the second conductive layer by IPL irradiation.

5. A method of making a semiconductor device, comprising:

providing a substrate;

disposing an electrical component over the substrate;

depositing an encapsulant over the electrical component;

forming a conductive layer over the substrate opposite the electrical component, wherein the conductive layer includes a plurality of graphene-coated metal balls;

sintering the conductive layer by intensive pulsed light (IPL) irradiation;

forming an insulating layer over the conductive layer; and forming a second conductive layer over the insulating layer, wherein the second conductive layer includes a plurality of graphene-coated metal balls.

6. The method of claim 5, wherein the plurality of graphene-coated metal balls comprises a plurality of cores formed from copper or silver, and each of the plurality of cores includes a graphene coating.

7. The method of claim 5, further including depositing the conductive layer by jet printing.

8. The method of claim 5, further including sintering the second conductive layer by IPL irradiation.

9. The method of claim 8, further including:

forming a second insulating layer over the second conductive layer;

forming a third conductive layer over the second insulating layer; and sintering the third conductive layer by IPL irradiation.

10. A method of making a semiconductor device, comprising:

providing a substrate;

disposing an electrical component over the substrate;

depositing an encapsulant over the electrical component;

forming a conductive layer over the substrate opposite the electrical component, wherein the conductive layer includes a plurality of graphene-coated metal balls;

forming an insulating layer over the conductive layer; and forming a second conductive layer over the insulating layer, wherein the second conductive layer includes a second plurality of graphene-coated metal balls.

11. The method of claim 10, further including:

forming a second insulating layer formed over the second conductive layer; and forming a third conductive layer over the second insulating layer, wherein the third conductive layer includes a third plurality of graphene-coated metal balls.

12. The method of claim 10, wherein each one of the plurality of graphene-coated metal balls includes a copper core.

13. The method of claim 10, wherein each one of the plurality of graphene-coated metal balls includes a silver core.

14. The method of claim 10, wherein a first portion of the plurality of graphene coated metal balls includes copper cores and a second portion of the plurality of graphene-coated metal balls includes silver cores.

* * * * *